United States Patent
Horng et al.

(10) Patent No.: US 8,736,355 B2
(45) Date of Patent: May 27, 2014

(54) DEVICE LAYOUT FOR REFERENCE AND SENSOR CIRCUITS

(75) Inventors: Jaw-Juinn Horng, Hsinchu (TW); Chung-Hui Chen, HsinChu (TW); Sun-Jay Chang, Hsinchu (TW); Chia-Hsin Hu, Changhua (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 46 days.

(21) Appl. No.: 13/494,060

(22) Filed: Jun. 12, 2012

(65) Prior Publication Data

US 2013/0328614 A1 Dec. 12, 2013

(51) Int. Cl.
*G05F 1/10* (2006.01)

(52) U.S. Cl.
USPC ........... 327/539; 327/513; 257/197; 257/565; 438/309

(58) Field of Classification Search
None
See application file for complete search history.

(56) References Cited

U.S. PATENT DOCUMENTS

| | | | | |
|---|---|---|---|---|
| 5,126,805 A | * | 6/1992 | Bulat et al. | 257/136 |
| 5,965,931 A | * | 10/1999 | Wang et al. | 257/585 |
| 6,049,098 A | * | 4/2000 | Sato | 257/198 |
| 6,396,107 B1 | * | 5/2002 | Brennan et al. | 257/362 |
| 6,559,020 B1 | * | 5/2003 | Salmi | 438/312 |
| 6,803,259 B2 | * | 10/2004 | Lee | 438/133 |
| 7,235,846 B2 | * | 6/2007 | Fung | 257/355 |
| 7,285,470 B2 | * | 10/2007 | Bock et al. | 438/309 |
| 7,459,367 B2 | * | 12/2008 | Voegeli et al. | 438/309 |
| 7,732,835 B2 | * | 6/2010 | Voegeli et al. | 257/183 |
| 8,410,582 B2 | * | 4/2013 | Bandyopadhyay et al. | 257/656 |
| 2006/0220064 A1 | * | 10/2006 | Joodaki et al. | 257/197 |
| 2009/0218601 A1 | * | 9/2009 | Stephan et al. | 257/252 |
| 2010/0032804 A1 | * | 2/2010 | Balster et al. | 257/586 |
| 2010/0117721 A1 | * | 5/2010 | Hsieh et al. | 327/539 |
| 2011/0215789 A1 | * | 9/2011 | Bouwman et al. | 323/313 |
| 2012/0064688 A1 | * | 3/2012 | Chen et al. | 438/312 |

OTHER PUBLICATIONS

Mok, P.K.T. et al., "Design Considerations of Recent Advanced Low-Voltage Low-Temperature-Coefficient CMOS Bandgap Voltage Reference", Proceedings of the IEEE 2004 Custom Integrated Circuits Conference, 2004, 8 pages.

* cited by examiner

*Primary Examiner* — Thomas J Hiltunen
(74) *Attorney, Agent, or Firm* — Duane Morris LLP (57) ABSTRACT

A band gap reference circuit includes an error-amplifier-based current mirror coupled between a first supply node and a pair of intermediate voltage nodes, and a matched diode pair for providing a proportional-to-absolute temperature (PTAT) current. The matched diode pair includes a first diode connected between a first intermediate voltage node from the pair of intermediate voltage nodes and a second supply node, and a second diode connected in series with a resistor between a second intermediate voltage node from the pair of intermediate voltage nodes and the second supply node. Each diode has a P-N diode junction that is a homojunction.

18 Claims, 11 Drawing Sheets

DEVICE LAYOUT FOR REFERENCE AND SENSOR CIRCUITS

TECHNICAL FIELD

The present disclosure relates to bandgap reference and thermal sensor circuits, and more specifically to layout patterns for devices used therein.

BACKGROUND

The parasitic BJT is a basic component in traditional bandgap reference and thermal sensor circuit designs. Various designs based on the parasitic BJT are described in Philip K. T. Mok and Ka Nang Leung, "Design Considerations of Recent Advanced Low-Voltage Low-Temperature-Coefficient CMOS Bandgap Voltage Reference", IEEE 2004 Custom Integrated Circuits Conference, which is incorporated by reference herein. However, in advanced processes such as 20 nm and below FinFET processes, the P/N junction of the parasitic BJT has poor performance. These gate length nanometer devices have short gate lengths and thus high p+ source/drain doping to improve the device speed. However, they suffer from large leakage current. The PMOS p-type source/drain regions are changed from a p+ dopant like boron to a deposited SiGe epitaxial layer to improve current performance. This changes the P-type portion of the parasitic PNP BJT to SiGe. With this change, however, a P/N junction of the parasitic BJT is changed from a homojunction to a heterojunction. Extra masking steps are required to remove the SiGe epitaxial layer of the parasitic SiGe BJT to provide better linearity performance of the I-V curve.

BRIEF DESCRIPTION OF THE DRAWINGS

The accompanying drawings illustrate preferred embodiments of the invention, as well as other information pertinent to the disclosure, in which.

DETAILED DESCRIPTION

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

A diode structure is disclosed herein for use in the traditional process node to replace the parasitic BJT component use in, for example, bandgap reference circuits. In embodiments, the process node is a 20 nm, 14 nm or below FinFET process. The diode structure can be used to implement a layout pattern for bandgap reference and thermal sensor circuits. The new structure does not suffer from the P/N heterojunction issue described above and thus has superior performance. Without the heterojunction issue, additional masks are not needed to remove the SiGe epitaxial layer. This approach also has a good performance/area relationship.

A traditional bandgap reference circuit includes two basic components—the PNP BJT and a PMOS transistor, or a NPN BJT and NMOS transistor. As described herein the PNP can be replaced with a diode. This new component still needs to work with the PMOS in the same manner that the PNP BJT did. Therefore, the diode is sometimes referred to herein as a PNP-like diode (or NPN-like diode as appropriate).

Figure 1A:
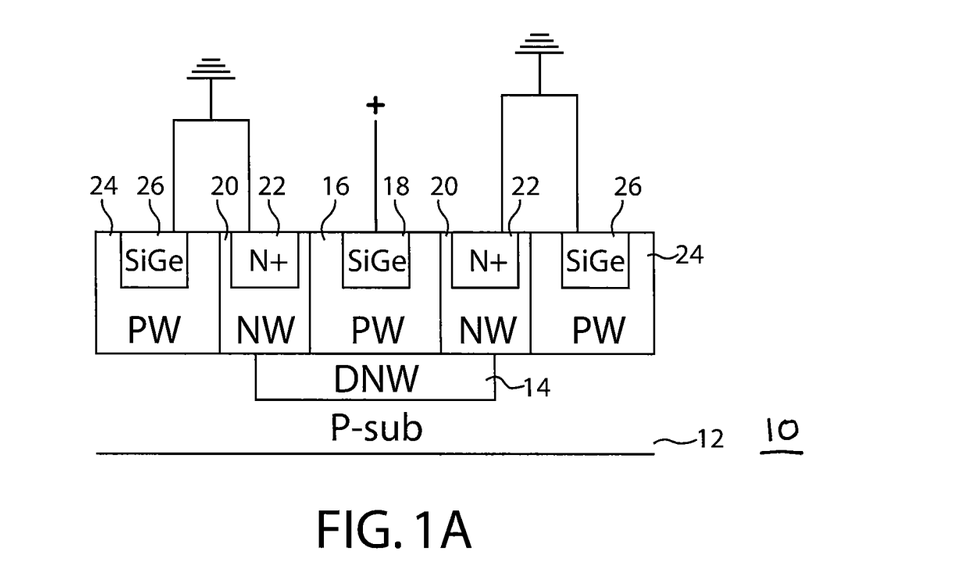
FIG. 1A is a side view of a layout design of a unit cell for a PNP diode.
Figure 1B:
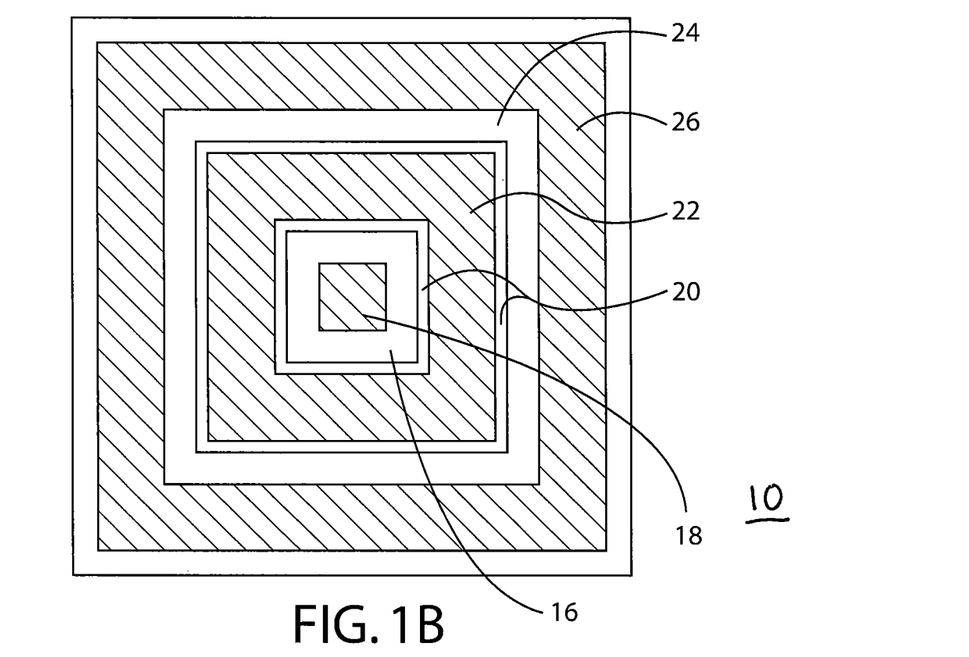
FIG. 1B is a top view of the layout design of FIG. 1A.

FIG. 1A is a side view and FIG. 1B is a top view for a layout pattern of an embodiment of a PNP-like diode structure 10 that can be used as a replacement for the parasitic BJT discussed above. More specifically, the figures illustrate a single square-shaped unit cell structure that can be extended to a matched diode in a ratio of 1:N where N=2 or $X^2-1$ with X being an integer greater than 2. That is, if N=3, then the ratio is 1:8; if N=4, then the ratio is 1:15, and so on. Matched structures formed from multiple unit cells exhibit little mismatch since the unit cells are formed together. The diode structure 10 includes a deep n-well 14 formed in a p-type substrate 12. The structure also includes a first p-well 16 having a SiGe ohmic contact region 18 formed therein. As will be understood, the SiGe region can be a deposited epitaxial layer that is driven into the p-well region 16 by thermal annealing. Other features of the structure 10 surround the p-well 16 in concentric rings. The first p-well 16 is surrounded by an n-well region 20 having an N+ implant ohmic contact region 22 therein. A second p-well region 24 surrounds the n-well region 20 and has a second SiGe ohmic contact region 26 formed therein. Region 26 can serve as a substrate guard ring. In order to simplify the top view of FIG. 1B, the substrate 12 and deep n-well 14 are not shown, and the contact regions 18, 22, 26 are shown in cross-hatch. The area of p-well region 16 can be, in embodiments, a square region of $1.6 \times 1.6\ \mu m^2$, $2.0 \times 2.0\ \mu m^2$, $5.0 \times 5.0\ \mu m^2$, $10.0 \times 10.0\ \mu m^2$ or other sizes. The n-well region 20 and deep n-well 14 are connected to ground.

In the above-described structure, the P-N diode junction is formed between the p-well region 16 and the n-well region 20. This junction is a homojunction rather than heterojunction. That is, the traditional PNP BJT is a P+/n-well/P-substrate structure. Replacing the P+ region with SiGe would results in a SiGe/n-well heterojunction. Compared with that structure, the P-N junction of FIG. 1A (p-well region 16/n-well region 20) exhibits better linearity than the SiGe/n-well heterojunction described above and in the background section.

Figure 1C:
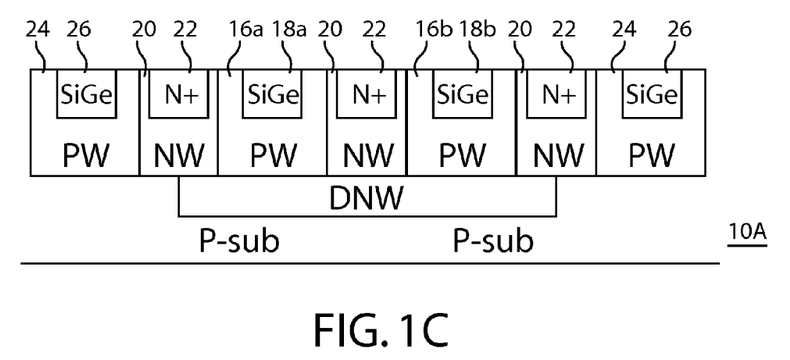
FIG. 1C is a side view of two unit cells based on the layout design of FIG. 1A.
Figure 1D:
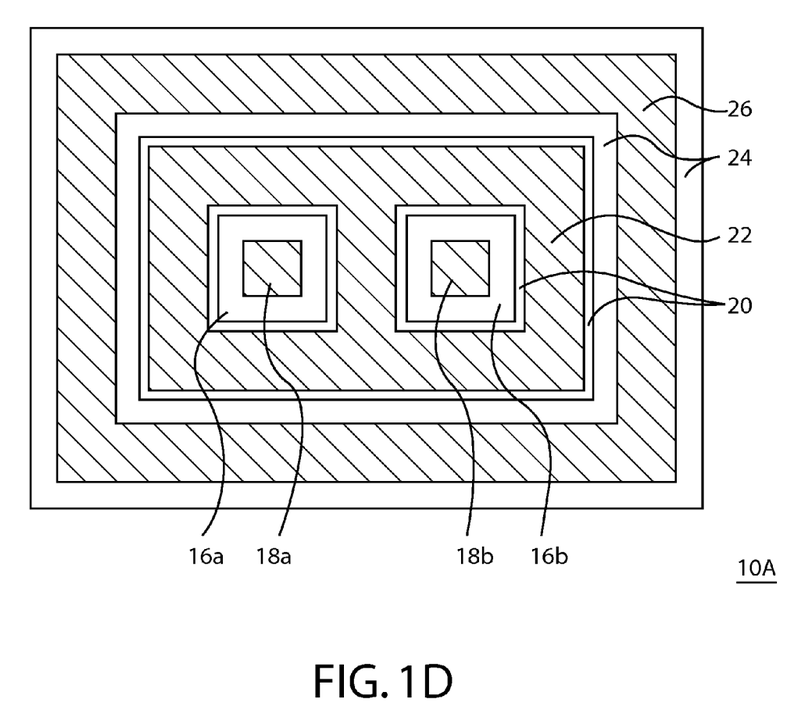
FIG. 1D is a top view of the layout design of FIG. 1D.

FIGS. 1C and 1D illustrate a structure 10A based on the PNP-like diode unit cell structure of FIGS. 1A and 1B. More specifically, the structure 10A has two unit cells. Like features from FIGS. 1A and 1B are marked with like references in FIGS. 1C and 1D. P-well region 16a is the central p-well region for a first unit cell and p-well region 16b forms the central p-well region for a second unit cell. N-well region 20 surrounds p-well regions 16a, 16b. N+ implant ohmic contact region 22 is formed within n-well regions 20. A p-well region 26 and SiGe guard ring 26 are formed around the n-well region 20. This layout example can be used for circuits having a 1:1 PNP BJT ratio, i.e., for designs that use the same BJT ratio but only change the PMOS current mirror ratio.

Figure 1E:
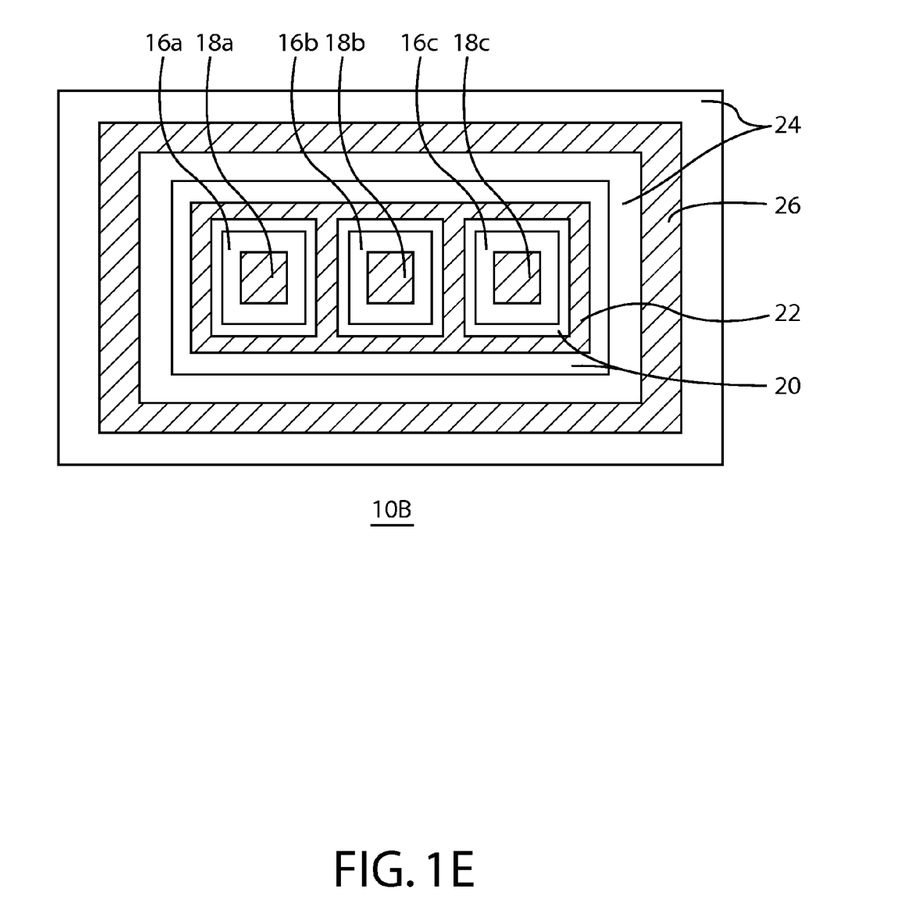
FIG. 1E is a top view of a matched diode layout design having three unit cells based on the unit cell of FIG. 1A.

FIG. 1E illustrates a matched diode layout 10B in a ratio of 1:2 having three unit cells. The layout includes p-wells 16a, 16b, 16c and SiGe contact regions 18a, 18b, 18c formed therein.

Figure 1F:
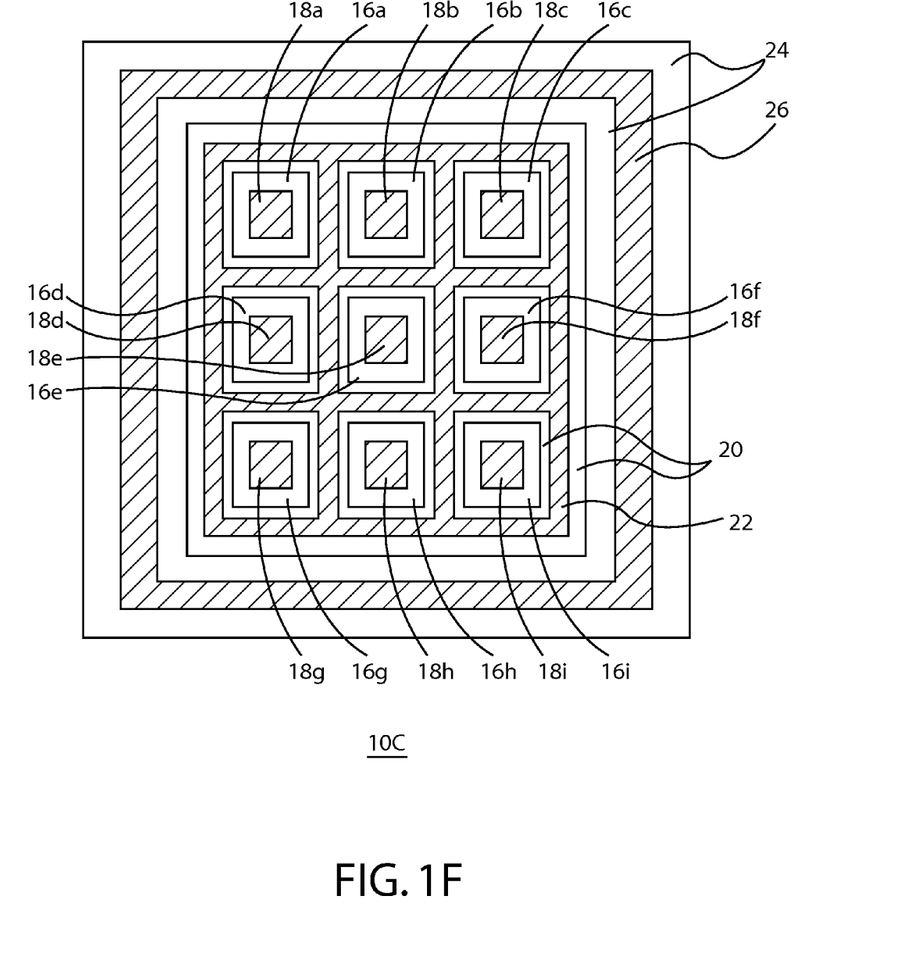
FIG. 1F is a top view of a common centroid matched diode layout design based on the unit cell of FIG. 1A.

FIG. 1F illustrates a matched diode layout 10C in a ratio of 1:8 having nine unit cells arranged in three rows and three columns. The layout includes p-wells 16a to 16i and corresponding SiGe implant regions 18a to 18i. In this embodiment, to save area, a single guard ring 26 is formed around the array of unit cells and all N+ cathode contacts 22 are connected to each other. Guard ring 26 and N+ contacts 22 are commonly coupled to ground.

Figure 2A:
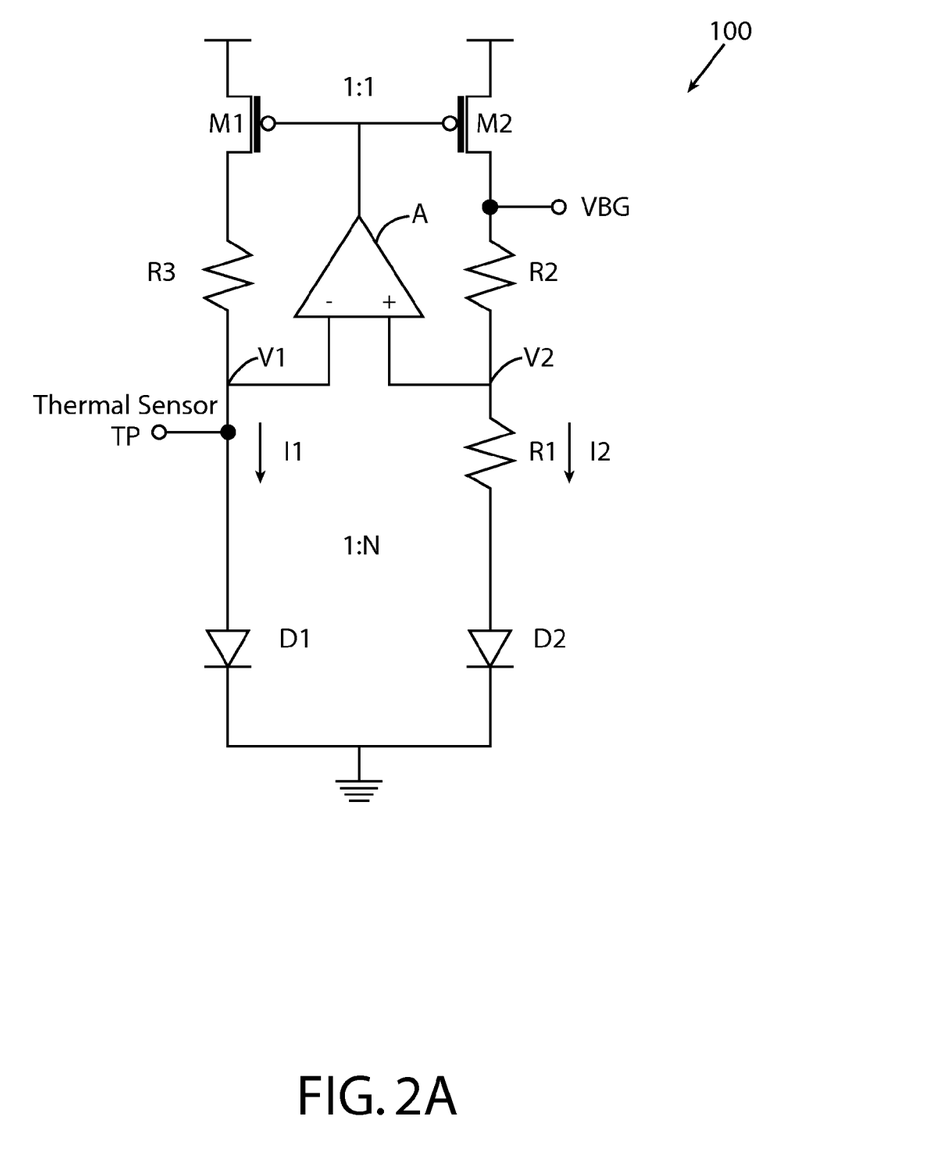
FIG. 2A illustrates a bandgap reference circuit.

FIG. 2A illustrates a bandgap reference circuit 100. The device uses an error-amplifier-based current mirror. The relationship of temperature versus Vp/n (i.e., the junction voltage of the p-well and n-well) can be measured at node TP. They are inversely proportional to one other. Therefore, the voltage variation on this node senses temperature. The voltage difference between D1 and D2 can also be used as a temperature sensor. By calculating the voltage difference of D1 and D2, it is found that the dVp/n is linearly proportional to temperature variation (PTAT). The equation is as follows: dVp/n=VT×Ln (N), where. VT is an approximation of KT/q (with K being Boltzmann's constant, T being absolute temperature, q being one electronic charge ($1.6 \times 10^{-19}$ C)) and N is the BJT ratio. Specifically, the device includes a current mirror formed from PMOS transistors M1 and M2. The output of a differential amplifier A is coupled to the gates of transistors M1 and M2. The drains of the transistors M1 and M2 are coupled to the inputs of the differential amplifier A through resistors R3 and R2, respectively. Ideally the amplifier A has a high gain and, therefore, the voltages V1=V2 can be achieved. When R2=R3, very good current matching by M1 and M2 can be obtained. A bandgap reference voltage VBG is provided at the voltage node between R2 and M2 without the need for an extra current branch. Alternatively, the reference voltage may be provided at the voltage node between R3 and M1. In this device 100, diodes D1 and D2 are coupled between the ground node and intermediate voltage nodes V1 and V2. Diode D2 is connected in series with a resistor R1. The current mirror enforces branch currents I1 and I2 equal to a proportional-to-absolute temperature (PTAT) current generated in accordance with the diode ratio of D1 and D2. The diodes provide the parasitic BJTs for the bandgap circuit. A bandgap reference voltage with low temperature coefficient can be easily obtained by optimizing temperature-independent circuit parameters like R1, R2, R3 and N. In embodiments, diodes D1 and D2 are provided as matched diodes in a 1:N diode ratio, which reduces the error in the reference voltage. Diodes D1 and D2 can be provided using a matched diode structure based on the unit cell layout 10 described above. Because R2 and R3 should be same value in this design, the bandgap output voltage only depends on the ratio of R1/R2 and N, which in this case is the diode ratio. The bandgap reference output voltage is, therefore, independent of process variation.

Figure 2B:
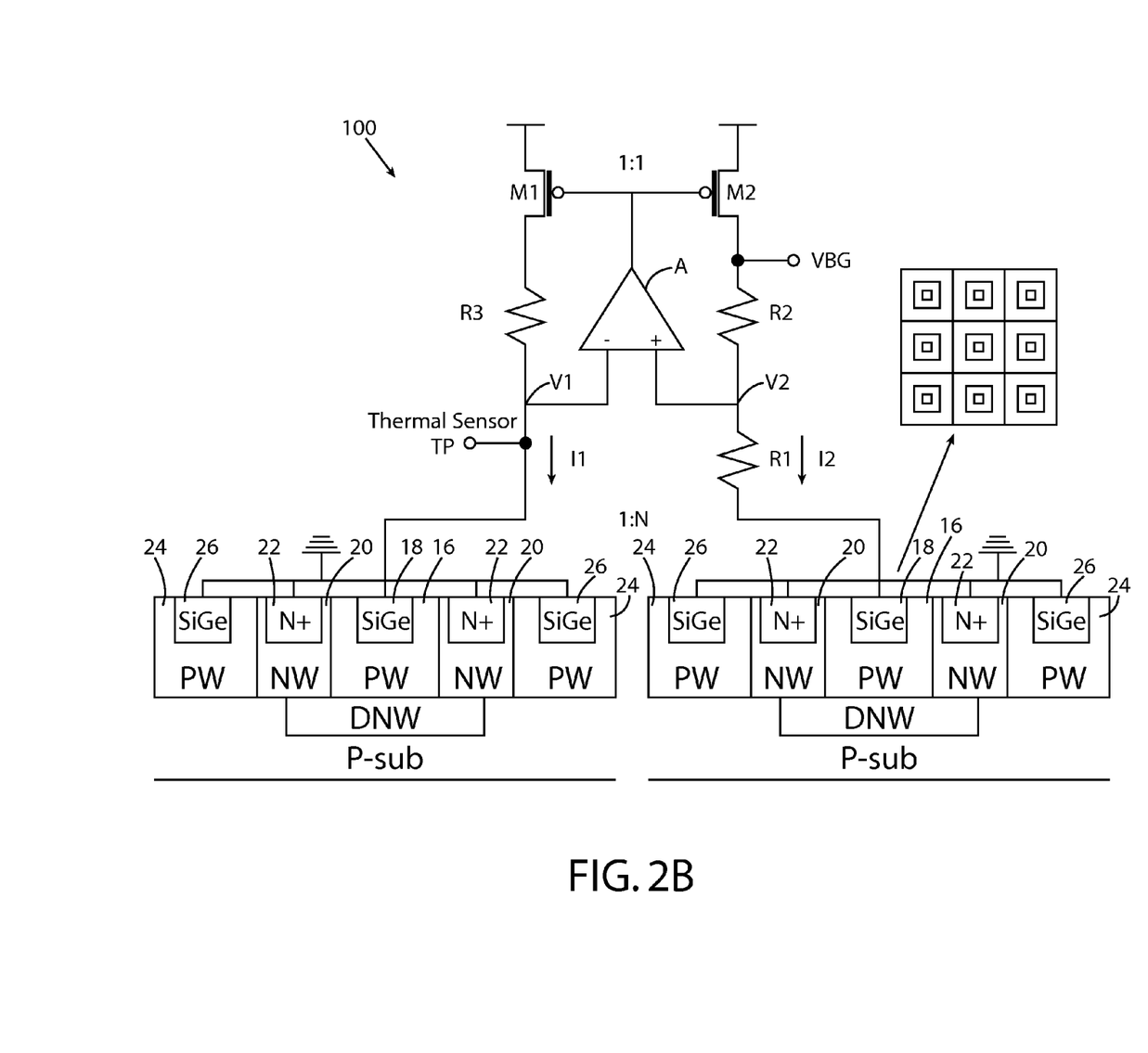
FIG. 2B illustrates the bandgap reference sensor circuit of FIG. 2A utilizing the unit cell diode layout of FIG. 1A.

With reference to FIG. 2B, diode D1 can be provided by a single unit cell structure 10 as described above in connection with FIG. 1A. Within this unit cell structure, the central SiGe contact region 18 within the central p-well 16 is coupled to intermediate voltage node V1 while the guard ring 26 and n-well N+ implant region 22 are grounded. To provide a 1:8 matched diode ratio, by way of example, the diode D2 is provided by eight unit cells 10. Specifically, a single common centroid structure such as shown in FIG. 1F having nine unit cells could provide both diodes D1 and D2. This could be done, for example, by connecting the SiGe contact region 18e of the center-most unit cell to node V1 while the SiGe contact regions 18a-18d and 18f-18i of all other unit cells would be coupled to node V2. Of course, other ratios could be used as dictated by the design of the bandgap circuit.

Figure 3:
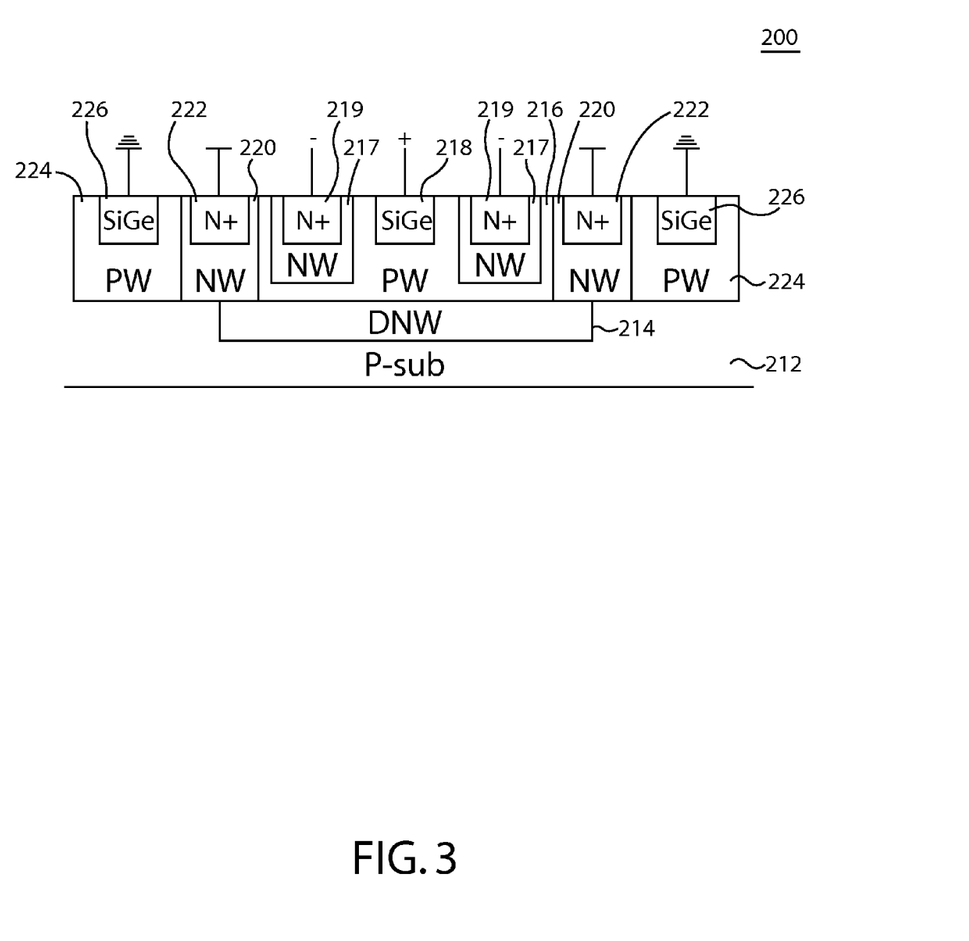
FIG. 3 illustrates a side view of a layout design of a unit cell for an embodiment of an NPN diode.

FIG. 3 illustrates a side view of an NPN-like diode layout pattern 200. The layout is compatible with that of the PNP-like diode layout pattern described above in connection with FIGS. 1A and 1B with only slight modifications. Like unit cell 10, the diode structure is formed over a p-type substrate 212. A deep n-well 214 is formed in the substrate. A central p-well 216 has a central SiGe contact region 218. This p-well 216 is surrounded by an n-well 220, having a N+ implant region 222. The n-well 220 is surrounded by a p-well 224 having a SiGe contact region 226 formed therein. Thus far, the structure is identical to the unit cell 10. Unlike unit cell 10, the layout 200 includes an n-well ring 217 formed in the p-well 216. This n-well ring includes an N+ implant region 219 formed therein. The SiGe region 226 is grounded and the N+ implant region 222 of the n-well 220 is coupled to the high voltage supply VDD. The positive (cathode) contact of the diode structure corresponds to SiGe region 218 and the negative (anode) contact of the diode structure corresponds to N+ implant region 219. The P-N junction formed between the p-well region 216 and the n-well region 217 is a homojunction rather than a heterojunction. As such, this p-well/n-well junction exhibits better linearity than would a SiGe/n-well junction as discussed above.

Figure 4A:
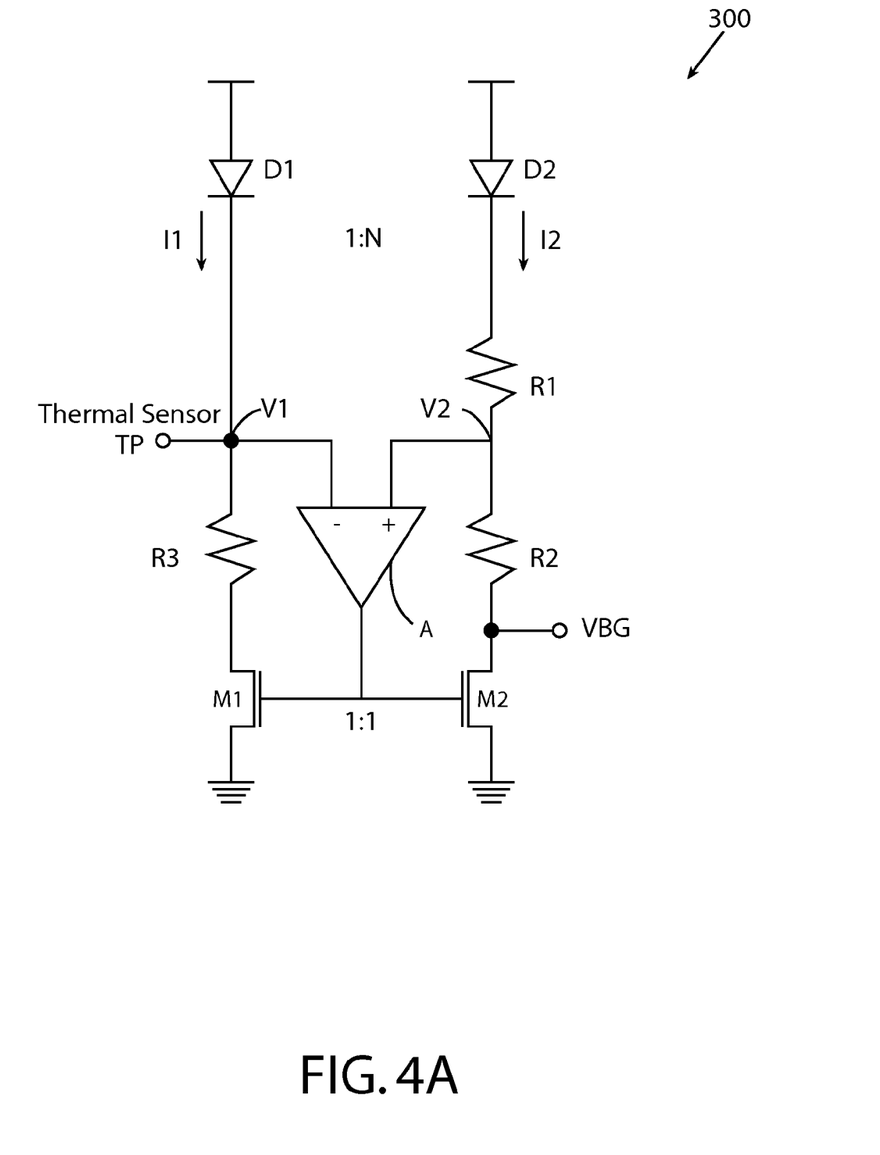
FIG. 4A illustrates another embodiment of a bandgap reference circuit.
Figure 4B:
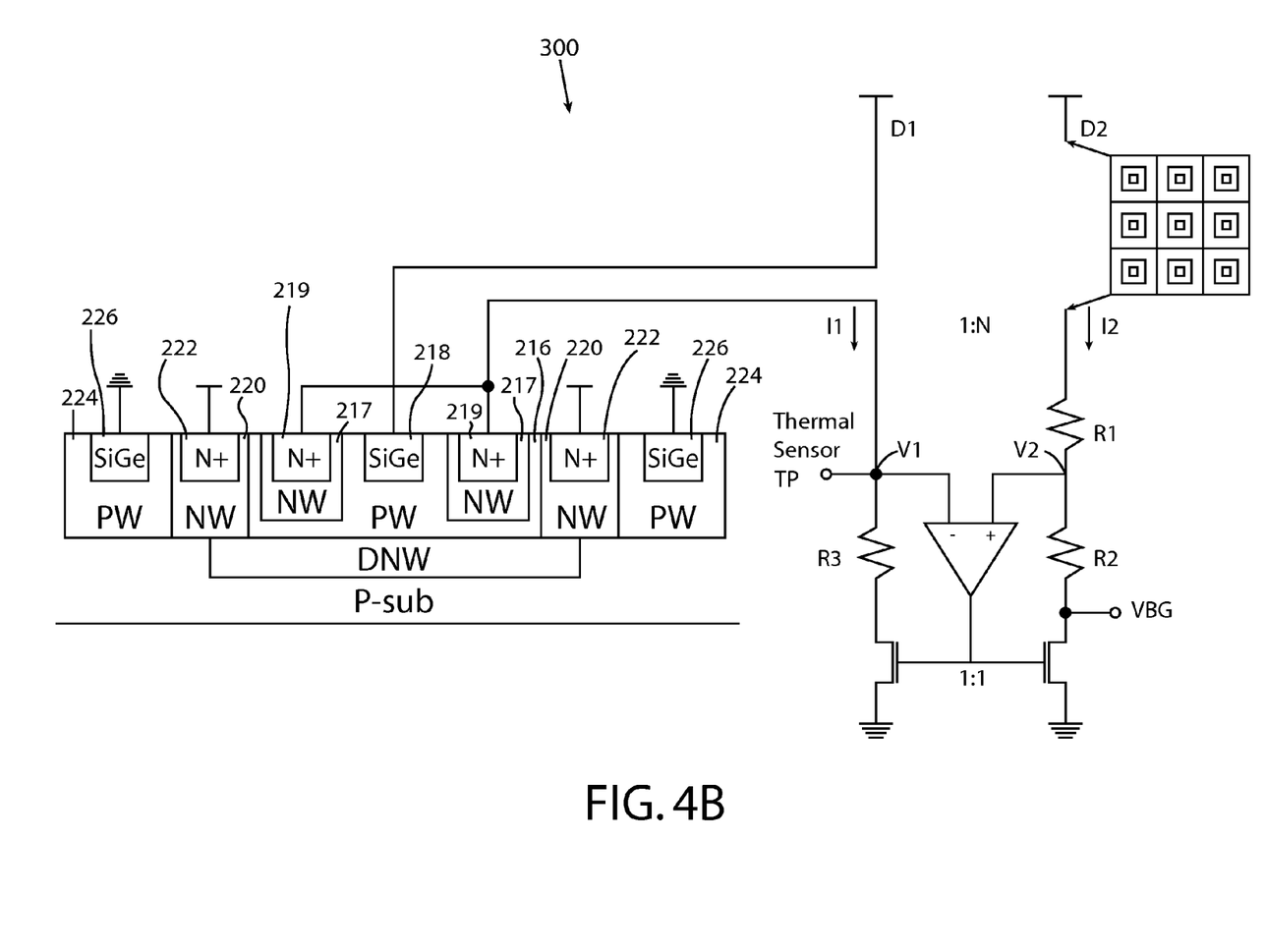
FIG. 4B illustrates the bandgap reference circuit of FIG. 4A utilizing the unit cell diode layout of FIG. 3.

FIG. 4A illustrates an alternative embodiment of a combined bandgap reference circuit and thermal sensor device 300. This device is similar to the device 100 of FIG. 2A only it uses NMOS transistors M1 and M2 as the current mirror. As such, diodes D1 and D2 are coupled between the high supply node (e.g., VDD) and nodes V1 and V2, respectively. Diodes D1 and D2 are implemented using the NPN-like diode structure of FIG. 3 rather than the PNP-like diode structure described above in connection with FIGS. 2A and 2B. FIG. 4B shows the connection of the diode structure 200 in the circuit 300. As with the example of FIG. 2B, a single unit cell can provide the diode D1 whereas multiple unit cells provide the diode D2. Diodes D1 and D2 can be provided in a matched diode having ratio 1:N. Diode D1 has its SiGe contact region 218 coupled to the VDD node and its N+ implant region 219 coupled to node V1. The unit cells that form the diode D2 simply have their implant regions 219 coupled to node V2 (through resistor R1) rather than to node V1.

Figure 5:
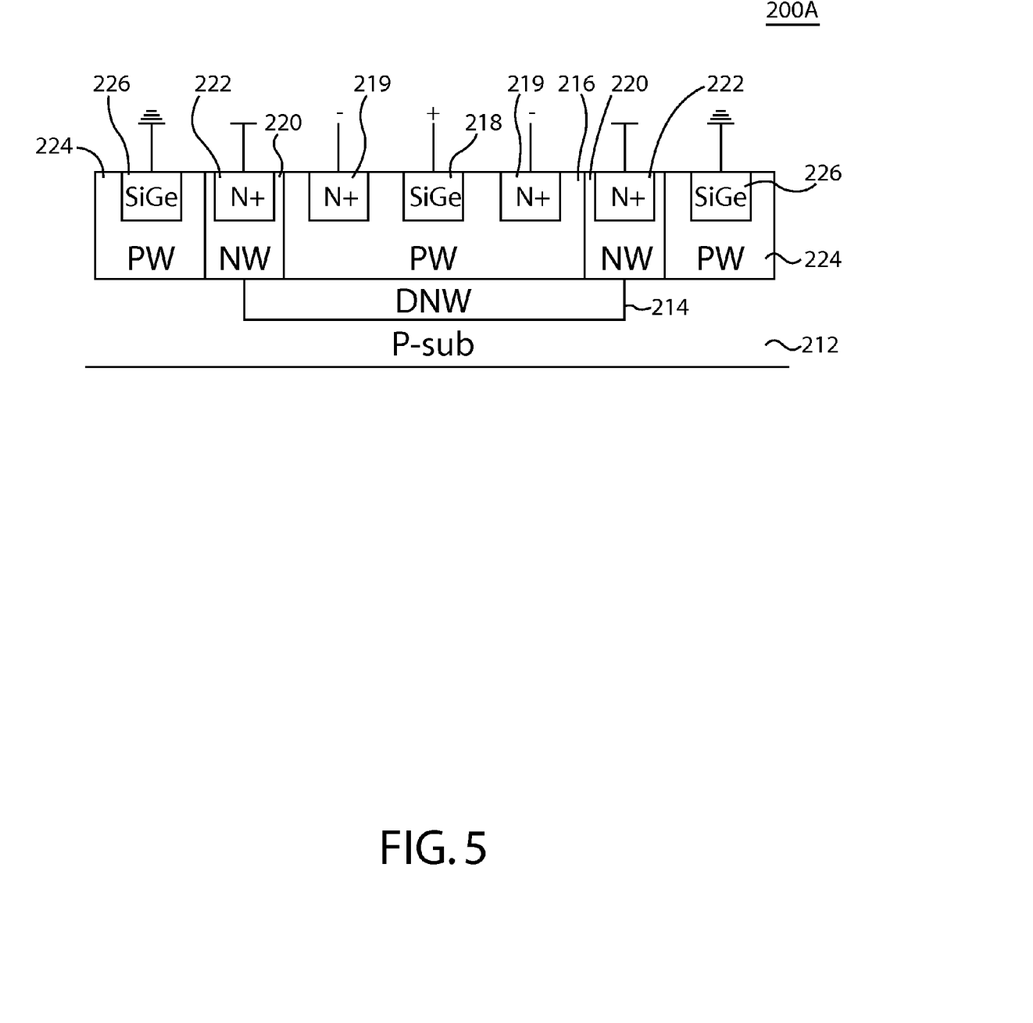
FIG. 5 illustrates a side view of a layout design of a unit cell for another embodiment of an NPN diode.

FIG. 5 illustrates a design layout 200A for unit cell structure of an alternative embodiment of a NPN-like diode layout pattern. This layout pattern is identical to that of the unit cell structure 200 of FIG. 3 only it does not have n-well regions 217 formed in p-well 216. Therefore, the P-N diode junction formed between the p-well region 216 and the N+ implant region 219 is a heterojunction. And at this time, the operation diode junction is PW/N+. That is, the operating diode junction is PW/N+. However, this heterojunction structure has better linearity than the heterojunction that would be formed by a SiGe/n-well junction. This diode structure can be substituted for the diode structure of the bandgap reference circuit of FIG. 4B. Alternatively, this NPN-like diode can be grouped in a bandgap reference circuit with PMOS transistors, as discussed below in connection with FIG. 6, and its biasing is similar to that of a PNP-like diode.

Figure 6:
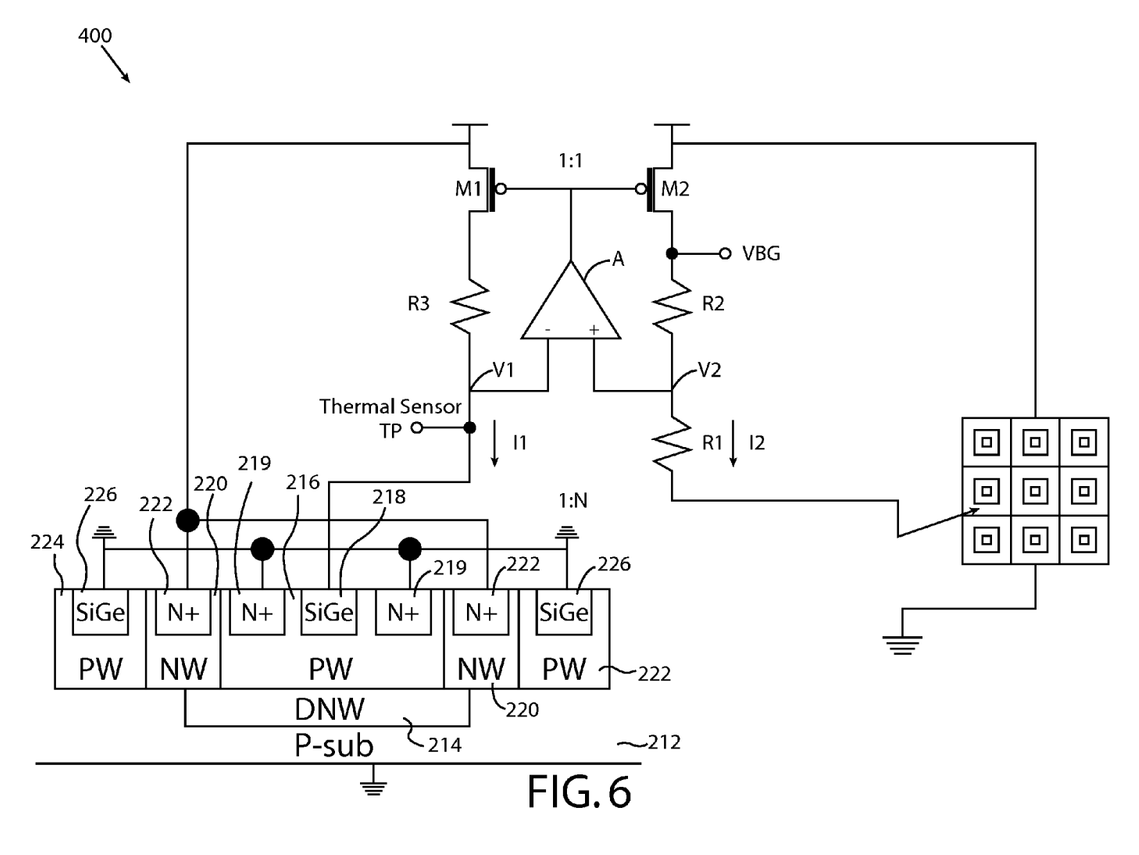
FIG. 6 illustrates another embodiment of a bandgap reference circuit utilizing the unit cell diode layout of FIG. 5.

FIG. 6 illustrates another embodiment of a bandgap reference circuit 400 utilizing the unit cell diode layout 200A of FIG. 5. In this embodiment diode D1 is a unit cell and connected between V1 and ground. Specifically, the p-substrate 212 is grounded along with the SiGe contact region 226 and N+ contact region 219. N+ contact region 222 is coupled to VDD. SiGe contact region 218 is coupled to node V1. Diode D2 is provided by N number of other unit cells from an array of unit cells. Those unit cells are biased in the same manner as the unit cell of diode D1 only their respective SiGe contact regions 218 are coupled to node V2 through resistor R1.

In certain embodiments of a band gap reference circuit, the bandgap reference circuit includes an error-amplifier-based current mirror coupled between a first supply node and a pair of intermediate voltage nodes, and a matched diode pair for providing a proportional-to-absolute temperature (PTAT) current. The matched diode pair includes a first diode connected between a first intermediate voltage node from the pair of intermediate voltage nodes and a second supply node, and a second diode connected in series with a resistor between a second intermediate voltage node from the pair of intermediate voltage nodes and the second supply node. Each diode has a P-N diode junction that is a homojunction.

In other embodiments of the band gap reference circuit, the bandgap reference circuit includes an error-amplifier-based current mirror coupled between a first supply node and a pair of intermediate voltage nodes and a matched diode pair for providing a proportional-to-absolute temperature (PTAT) current. The matched diode pair includes a first diode connected between a first intermediate voltage node from the pair of intermediate voltage nodes and a second supply node, and a second diode connected in series with a resistor between a second intermediate voltage node from the pair of intermediate voltage nodes and the second supply node. A ratio of the first diode to the second diode in the matched diode pair is 1:N, wherein N is 2 or $X^2-1$, where X is an integer greater than 2. Each diode includes a p-well having a SiGe contact region formed therein, an n-well surrounding the p-well, a N+ contact region, and a deep n-well underlying the p-well and n-well, wherein a P-N diode junction is formed between the p-well and n-well regions.

In certain embodiments, a matched diode formed in a p-type substrate is described including a plurality of unit cells. Each unit cell includes a deep n-well formed in the p-type substrate; a p-well formed over the deep n-well and having a SiGe contact region formed therein; a n-well formed over the deep n-well and around the p-well; and a N+ implant region. A P-N diode junction is formed between the p-well and n-well regions. The P-N diode junction is a homojunction.

In certain embodiments of a matched diode formed in a p-type substrate and includes a plurality of unit cells, each unit cell includes a deep n-well formed in the p-type substrate; a p-well formed over the deep n-well and having a SiGe cathode contact region formed therein; and a n-well having an N+ anode contact region formed therein, wherein the n-well and p-well form a P-N diode homojunction.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A band gap reference circuit, comprising:
an error-amplifier-based current mirror coupled between a first supply node and a pair of intermediate voltage nodes;
a matched diode pair for providing a proportional-to-absolute temperature (PTAT) current, the matched diode pair comprising:
a first diode connected between a first intermediate voltage node from the pair of intermediate voltage nodes and a second supply node; and
a second diode connected in series with a resistor between a second intermediate voltage node from the pair of intermediate voltage nodes and the second supply node,
wherein each diode has a P-N diode junction that is a homojunction, and
wherein each diode comprises a p-well having a SiGe contact region formed therein and an n-well surrounding the p-well and having an N+ contact region formed therein, wherein the P-N diode junction is formed between the p-well and the n-well.

2. The bandgap reference circuit of claim 1, wherein a ratio of the first diode to the second diode in the matched diode pair is 1:N, wherein N is 2 or $X^2-1$, where X is an integer greater than 2.

3. The bandgap reference circuit of claim 1,
wherein the first supply node is a power supply node and the second supply node is ground,
wherein the SiGe contact region of the first diode is coupled to the first intermediate voltage node and its N+ contact region of the first diode is coupled to the second supply node, and
wherein the SiGe contact region of the second diode is coupled to the second intermediate voltage node and the N+ contact region of the second diode is coupled to the second supply node.

4. A bandgap reference circuit, comprising:
an error-amplifier-based current mirror coupled between a first supply node and a pair of intermediate voltage nodes;
a matched diode pair for providing a proportional-to-absolute temperature (PTAT) current, the matched diode pair comprising:
a first diode connected between a first intermediate voltage node from the pair of intermediate voltage nodes and a second supply node; and
a second diode connected in series with a resistor between a second intermediate voltage node from the pair of intermediate voltage nodes and the second supply node,
wherein each diode has a P-N diode junction that is a homojunction, and
wherein each diode comprises a p-well having SiGe contact region formed therein, an n-well formed in the p-well around and spaced from the SiGe contact region, and a N+ contact region formed within the n-well, wherein the P-N diode junction is formed between the p-well and the n-well.

5. The bandgap reference circuit of claim 4,
wherein the first supply node is ground and the second supply node is a power supply node, wherein the first diode has its SiGe contact region coupled to the second supply node and its N+ contact region coupled to the first intermediate voltage node, and wherein the second diode has its SiGe contact region coupled to the second supply node and its N+ contact region coupled to the second intermediate supply node.

6. The bandgap reference circuit of claim 5, wherein each diode further comprises an n-well surrounding the p-well and having a second N+ contact region formed therein, the second N+ contact region being coupled to the second supply node.

7. A band gap reference circuit, comprising:
an error-amplifier-based current mirror coupled between a first supply node and a pair of intermediate voltage nodes;
a matched diode pair for providing a proportional-to-absolute temperature (PTAT) current, the matched diode pair comprising:
a first diode connected between a first intermediate voltage node from the pair of intermediate voltage nodes and a second supply node; and
a second diode connected in series with a resistor between a second intermediate voltage node from the pair of intermediate voltage nodes and the second supply node,
wherein a ratio of the first diode to the second diode in the matched diode pair is 1:N, wherein N is 2 or $X^2-1$, where X is an integer greater than 2,
wherein each diode comprises a p-well having a SiGe contact region formed therein, an n-well, a N+ contact region formed within the n-well, and a deep n-well underlying the p-well and n-well, a P-N diode junction being formed between the p-well and n-well.

8. The bandgap reference circuit of claim 7, wherein the n-well is formed around the p-well.

9. The bandgap reference circuit of claim 8,
wherein the first supply node is a power supply node and the second supply node is ground,
wherein the SiGe contact region of the first diode is coupled to the first intermediate voltage node and the N+ contact region of the first diode is coupled to the second supply node, and
wherein the SiGe contact region of the second diode is coupled to the second intermediate voltage node the N+ contact region is coupled to the second supply node.

10. The bandgap reference circuit of claim 7,
wherein the n-well is formed within the p-well around and spaced from the SiGe contact region.

11. The bandgap reference circuit of claim 10,
wherein the first supply node is ground and the second supply node is a power supply node,
wherein the first diode has its SiGe contact region coupled to the second supply node and its N+ contact region coupled to the first intermediate voltage node, and
wherein the second diode has its SiGe contact region coupled to the second supply node and its N+ contact region coupled to the second intermediate supply node.

12. The bandgap reference circuit of claim 11, further comprising a second n-well surrounding the p-well of each diode, the second n-well being coupled to the second supply node.

13. The bandgap reference circuit of claim 12, further comprising a second N+ contact region formed within the second n-well.

14. A matched diode formed in a p-type substrate, the matched diode comprising a plurality of unit cells, each unit cell comprising:
a deep n-well formed in the p-type substrate;
a p-well formed over the deep n-well and having a SiGe contact region formed therein;
a n-well formed over the deep n-well and around the p-well; and
a N+ implant region formed in the p-well around and spaced from the SiGe contact region,
wherein a P-N diode heterojunction is formed between the p-well and the N+ contact region.

15. The matched diode of claim 14, further comprising a second N+ implant region formed in the n-well.

16. A matched diode formed in a p-type substrate, the matched diode comprising a plurality of unit cells, each unit cell comprising:
a deep n-well formed in the p-type substrate;
a p-well formed over the deep n-well and having a SiGe cathode contact region formed therein; and
a n-well having an N+ anode contact region formed therein, wherein the n-well and p-well form a P-N diode homojunction.

17. The matched diode of claim 16, wherein the n-well is formed around the p-well.

18. The matched diode of claim 16, wherein the n-well is formed within the p-well.

* * * * *